(12) United States Patent
Jeon et al.

(10) Patent No.: US 10,211,186 B2
(45) Date of Patent: Feb. 19, 2019

(54) LIGHT EMITTING DEVICE PACKAGE ASSEMBLY AND METHOD OF FABRICATING THE SAME

(71) Applicant: LG ELECTRONICS INC., Seoul (KR)

(72) Inventors: Seongman Jeon, Seoul (KR); Moongoo Choi, Seoul (KR); Mangeun Kim, Seoul (KR); Jinwoo Sung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 5 days.

(21) Appl. No.: 15/217,629

(22) Filed: Jul. 22, 2016

(65) Prior Publication Data
US 2017/0054053 A1 Feb. 23, 2017

(30) Foreign Application Priority Data
Aug. 21, 2015 (KR) .......................... 10-2015-0117726

(51) Int. Cl.
*H01L 25/075* (2006.01)
*H01L 33/50* (2010.01)

(52) U.S. Cl.
CPC .......... *H01L 25/0753* (2013.01); *H01L 33/50* (2013.01); *H01L 33/505* (2013.01); *H01L 33/507* (2013.01); *H01L 2224/48091* (2013.01); *H01L 2924/181* (2013.01); *H01L 2933/0033* (2013.01); *H01L 2933/0041* (2013.01)

(58) Field of Classification Search
None
See application file for complete search history.

(56) References Cited

U.S. PATENT DOCUMENTS

| 8,870,402 B2 | 10/2014 | Yoon et al. | |
| 8,890,297 B2* | 11/2014 | Won | H01L 33/48 257/100 |
| 9,362,462 B2* | 6/2016 | Park | H01L 33/507 |
| 2004/0067366 A1* | 4/2004 | Gorczyca | B32B 27/38 428/413 |
| 2004/0208210 A1* | 10/2004 | Inoguchi | H01L 25/0753 372/36 |

(Continued)

FOREIGN PATENT DOCUMENTS

| JP | 2015-149469 A | 8/2015 |
| KR | 10-2012-0033033 A | 4/2012 |

(Continued)

*Primary Examiner* — Walter H Swanson
*Assistant Examiner* — Kien C Ly
(74) *Attorney, Agent, or Firm* — Birch, Stewart, Kolasch & Birch, LLP

(57) ABSTRACT

A light emitting device package assembly including a first substrate, a plurality of light emitting device packages disposed on the first substrate, and a light conversion member disposed on the light emitting device packages. Each of the light emitting device packages includes a main body disposed on the first substrate and including a first cavity, a light source disposed in the first cavity, and a first matrix disposed in the first cavity. Further, the light conversion member includes a second substrate including a plurality of second cavities, a second matrix disposed in the second cavities, and first light conversion particles disposed in the second matrix.

18 Claims, 13 Drawing Sheets

(56) References Cited

U.S. PATENT DOCUMENTS

| | | | |
|---|---|---|---|
| 2006/0124953 A1* | 6/2006 | Negley | H01L 33/486 257/99 |
| 2006/0255352 A1* | 11/2006 | Lin | F21K 9/00 257/98 |
| 2008/0038853 A1* | 2/2008 | Park | G02B 6/0031 438/26 |
| 2008/0203415 A1* | 8/2008 | Thompson | B29C 33/0022 257/98 |
| 2010/0320486 A1* | 12/2010 | Helbing | H01L 25/0753 257/89 |
| 2011/0316031 A1* | 12/2011 | Ooyabu | H01L 33/505 257/98 |
| 2012/0075835 A1 | 3/2012 | Yoon et al. | |
| 2012/0153311 A1 | 6/2012 | Yuan et al. | |
| 2012/0236531 A1* | 9/2012 | Lim | G09F 9/33 362/84 |
| 2012/0299036 A1* | 11/2012 | Liu | H01L 33/56 257/98 |
| 2012/0326183 A1* | 12/2012 | Min | H01L 33/38 257/88 |
| 2013/0026500 A1 | 1/2013 | Kim | |
| 2013/0037831 A1* | 2/2013 | Rudmann | H01L 25/167 257/88 |
| 2013/0056749 A1* | 3/2013 | Tischler | H01L 21/6835 257/76 |
| 2013/0228803 A1* | 9/2013 | Wakiya | H01L 33/508 257/88 |
| 2014/0049965 A1* | 2/2014 | Aanegola | H01L 33/44 362/259 |
| 2014/0300267 A1 | 10/2014 | Oh et al. | |
| 2014/0334137 A1* | 11/2014 | Hasenoehrl | H01L 25/0753 362/147 |
| 2014/0346547 A1 | 11/2014 | Park | |
| 2015/0055337 A1* | 2/2015 | Lin | H01L 25/0753 362/231 |
| 2015/0084072 A1* | 3/2015 | Huang | H01L 25/0753 257/88 |
| 2015/0171372 A1* | 6/2015 | Iwata | C09D 5/22 257/40 |
| 2015/0255505 A1* | 9/2015 | Jeoung | G06F 1/1652 257/89 |
| 2015/0340571 A1* | 11/2015 | Tsumori | H01L 33/502 257/98 |
| 2015/0371975 A1* | 12/2015 | Shimizu | H01L 33/486 257/88 |
| 2016/0013373 A1* | 1/2016 | Bhat | H01L 33/54 257/98 |
| 2016/0027970 A1* | 1/2016 | Shatalov | H01L 24/97 438/27 |
| 2016/0247976 A1* | 8/2016 | Rudmann | H01L 27/14618 |
| 2016/0320689 A1* | 11/2016 | Butterworth | H01L 33/58 |

FOREIGN PATENT DOCUMENTS

| | | |
|---|---|---|
| KR | 10-2013-0014256 A | 2/2013 |
| KR | 10-2013-0029547 A | 3/2013 |

* cited by examiner

LIGHT EMITTING DEVICE PACKAGE ASSEMBLY AND METHOD OF FABRICATING THE SAME

CROSS-REFERENCE TO RELATED APPLICATIONS

The present application claims priority under 35 U.S.C. 119 and 35 U.S.C. 365 to Korean Patent Application No. 10-2015-0117726 (Aug. 21, 2015), which is hereby incorporated by reference in its entirety.

BACKGROUND OF THE INVENTION

Field of the Invention

Embodiments relate to a light emitting device package and a method of fabricating the same.

Discussion of the Related Art

A backlight unit for a display device supplies light to a display panel including a liquid crystal. The backlight unit includes a light emitting device and units for effectively transmitting light output from the light emitting device to the liquid crystal.

Further, a light emitting diode may be used as a light source of the display apparatus. Also, an optical sheet can be stacked to effectively transmit light output from the light source to the display panel. In addition, an optical member which changes a wavelength of the light emitted from the light source to allow white light to be incident into the display panel can be included in the display apparatus. Particularly, to change the wavelength of the light, quantum dots may be used.

Further, the optical member can use an optical sheet or be disposed on the light source. When the optical member is disposed on the light source, light conversion particles may be damaged by heat from the light source or be deformed by external moisture and oxygen. Also, when the optical member is disposed on the light source, the process efficiency may be deteriorated.

SUMMARY OF THE INVENTION

Accordingly, one object of the present invention is to address the above-identified and other problems with the related art.

In one aspect, the present invention provides a light emitting device package assembly that is easily fabricated and has an improved reliability and a method of fabricating the same.

To achieve these and other advantages and in accordance with the purpose of the present invention, as embodied and broadly described herein, the present invention provides in one aspect a light emitting device package assembly including a first substrate, a plurality of light emitting device packages disposed on the first substrate, and a light conversion member disposed on the light emitting device packages. Each of the light emitting device packages includes a main body disposed on the first substrate and including a first cavity, a light source disposed in the first cavity, and a first matrix disposed in the first cavity. Further, the light conversion member includes a second substrate including a plurality of second cavities, a second matrix disposed in the second cavities, and first light conversion particles disposed in the second matrix.

In another aspect, the present invention provides a method of manufacturing a light emitting device package assembly. The method includes preparing a plurality of light emitting device packages disposed on a first substrate; disposing a light conversion member on the plurality of light emitting device packages; and combining the first substrate with the light conversion member. Further, each of the light emitting device packages includes a main body disposed on the first substrate and including a first cavity; a light source disposed in the first cavity; and a first matrix disposed in the first cavity. In addition, the light conversion member includes a second substrate including a plurality of second cavities; a second matrix disposed in the second cavities; and first light conversion particles disposed in the second matrix.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Figure 1:
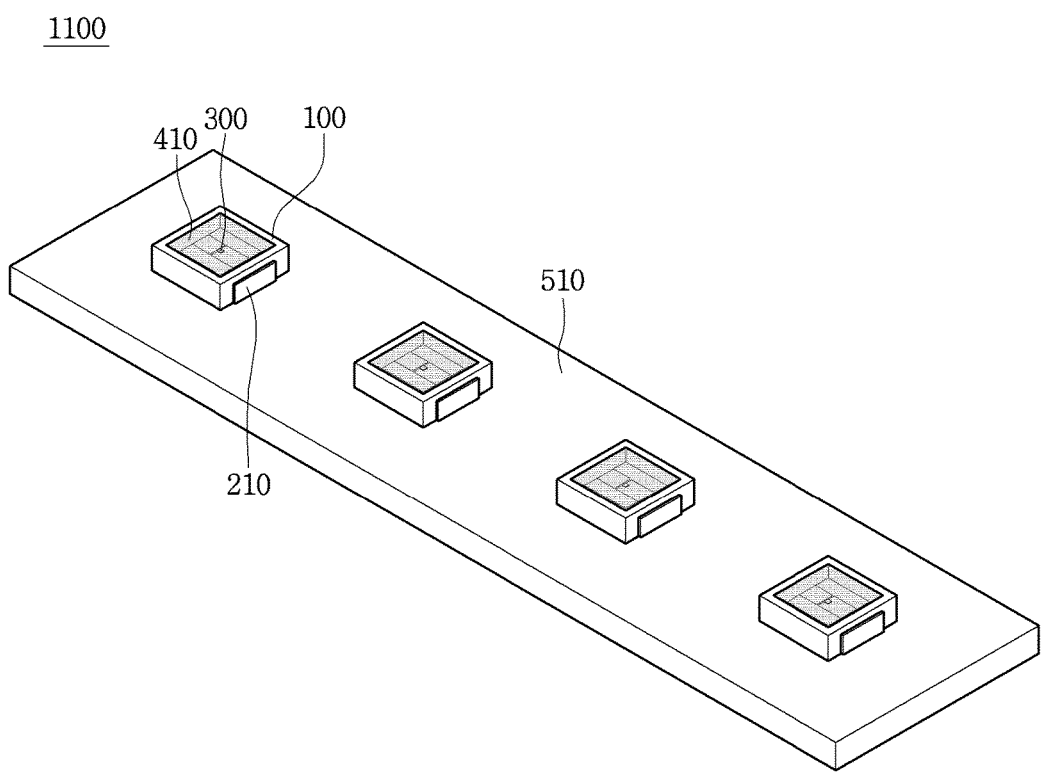
FIG. 1 is a perspective view of a light emitting device package according to an embodiment.

Advantages and features of the present disclosure, and implementation methods thereof will be clarified through following embodiments described with reference to the accompanying drawings. Since a shape, a ratio, an angle, a number, etc., which are shown in the accompanying drawings are exemplarily illustrated, the present disclosure is not limited thereto. Like reference numerals refer to like elements throughout.

When 'comprising', 'having', 'consisting of', etc. are used, other components can be added unless 'only' is used. Even when a component is explained in singular number they may be interpreted as plural number. When positional relation of two portions is explained by 'on', 'upper', 'lower', 'beside', etc., one or more components may be positioned between two portions unless 'just' is not used. x) When portions are connected by 'or', the portions are interpreted as including 'alone' as well as 'combination thereof' but when portions are connected by 'or', 'one of', portions are interpreted as 'alone'.

Also, in a backlight unit according to an embodiment, the terms "upper" and "lower" may be respectively defined as a side that is relatively adjacent to the display panel and a side that is relatively away from the display panel when the backlight unit is applied to the display apparatus. Also, in the display panel according to an embodiment, the terms "upper" and "lower" may be respectively defined as a side that is relatively away from the backlight unit and a side that is relatively adjacent to the backlight unit when the display panel is applied to the display apparatus.

Even though terms such as 'after', 'before', 'next to', 'and', 'herein', 'subsequent to', 'at this time', etc. are used, they are not used as limiting temporal position. Although the terms of first and second are used herein to describe various elements, these elements should not be limited by these terms. These terms are only used to distinguish one component from another component. Accordingly, a first component that will be described below may be a second component within the technical idea of the present disclosure.

Features of various embodiments of the present disclosure are partially or entirely coupled or combined with each other, and technically various interlocking and driving are enabled. Also, the embodiments may be independently performed with respect to each other, or performed in combination of each other.

Hereinafter, embodiments of the prevent disclosure will be described below in more detail with reference to the accompanying drawings. The following embodiments are provided as mere examples to sufficiently express the ideas of the present disclosure to the skilled in the art. The prevent disclosure may, however, be embodied in different forms and should not be construed as limited to the embodiments set forth herein.

Figure 2:
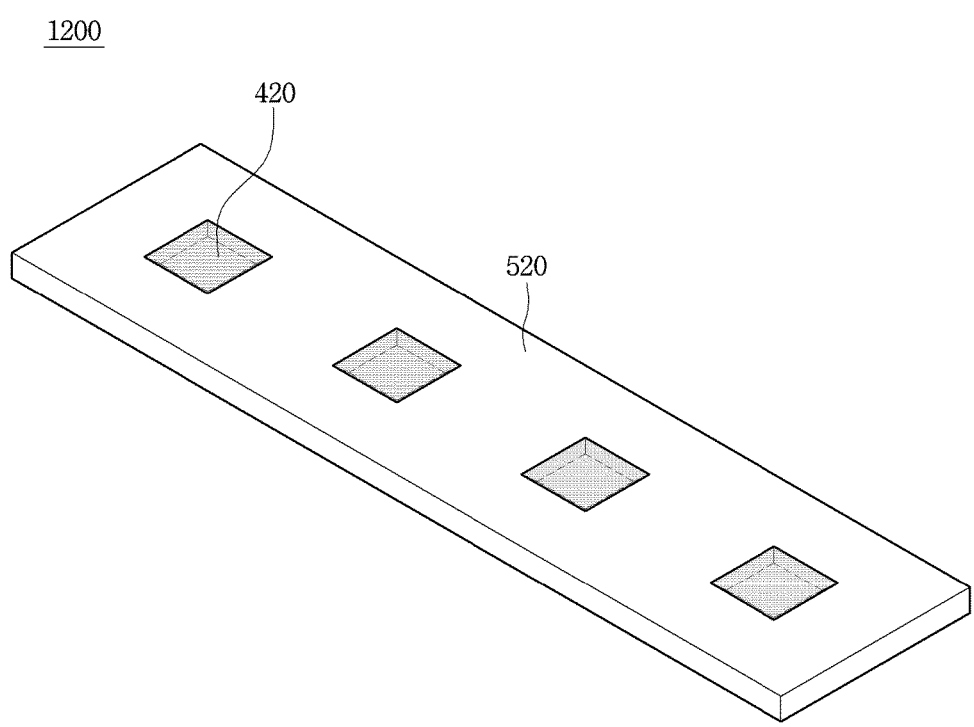
FIG. 2 is a perspective view of a light conversion member according to an embodiment.

Referring to FIGS. 1 to 5, a light emitting device package assembly 1000 according to an embodiment includes a light emitting device package 1100 and a light conversion member 1200. As shown in FIG. 2, the light conversion member 1200 is disposed on the light emitting device package 1100. In more detail, the light conversion member 1200 is disposed to be spaced apart from the light emitting device package 1100 on the light emitting device package 1100.

Further, the light emitting device package 1100 may include a main body 100, a plurality of lead electrodes 210 and 220, a light source 300, and a first matrix 410. The main body 100 may be formed of one of, for example, a resin material such as polyphthalamide (PPA), a ceramic material, a liquid crystal polymer (LCP), syndiotactic (SPS), poly (phenylene ether (PPS), and a silicon material. However, the present disclosure is not limited to the material of the main body 100. The main body 100 may be integrated by injection molding or have a structure in which a plurality of layers are stacked. The main body 100 can also be divided into a reflective part having a cavity and disposed above the lead electrodes and a body part disposed below the lead electrodes, but is not limited thereto.

In addition, a first cavity 110 having an opened upper side is defined in the main body 100. The first cavity 110 can be formed by performing a patterning, punching, cutting, or etching process on the main body 100. Also, the first cavity 110 can be formed by using a metal frame having the same shape as the first cavity 110 when the main body 100 is molded. The first cavity 110 may also have a cup shape or a concave container shape. Also, the first cavity 110 may have a surface shape such as a circular shape, a polygonal shape, or random shape, but is not limited thereto.

In addition, the first cavity 110 may have a side surface that is perpendicular to or inclined with respect to a bottom surface of the first cavity 110 in consideration of a light distribution angle of the light source 300. For example, the first cavity 110 may have a width that gradually increases in a direction away from the light source 300. In the drawings, although the first cavity 110 has an angled surface, an embodiment is not limited thereto.

For example, the first cavity 110 may have a curved surface. Since the first cavity 110 has the curved surface, the matrix can be more easily filled into the first cavity 110. In addition, the first cavity 110 can have a side surface that is coated with a high reflective material, for example, photo solder (PSR) resist ink, silver (Ag), or aluminum (Al) to improve light emitting efficiency of the light source 300.

In addition, the lead electrodes 210 and 220 may be implemented as a lead frame, but are not limited thereto. The lead electrodes 210 and 220 are also disposed in the main body 100. Further, the lead electrodes 210 and 220 can be disposed to be electrically separated from the bottom surface of the cavity 110. Outer portions of the lead electrodes 210 and 220 may also be exposed to the outside of the main body 100.

Further, ends of the lead electrodes 210 and 220 can be disposed on one side surface of the cavity 110 or a side surface opposite to the cavity 110. The lead electrodes 210 and 220 may also be implemented as the lead frame. The lead frame may be molded when the main body 100 is injection-molded. For example, the lead electrodes 210 and 220 may be first and second lead electrodes 210 and 220, respectively. In addition, the first and second lead electrodes 210 and 220 can be spaced apart from each other. Also, the first lead electrode 210 and the second lead electrode 220 can be electrically connected to the light source 300.

Figure 3:
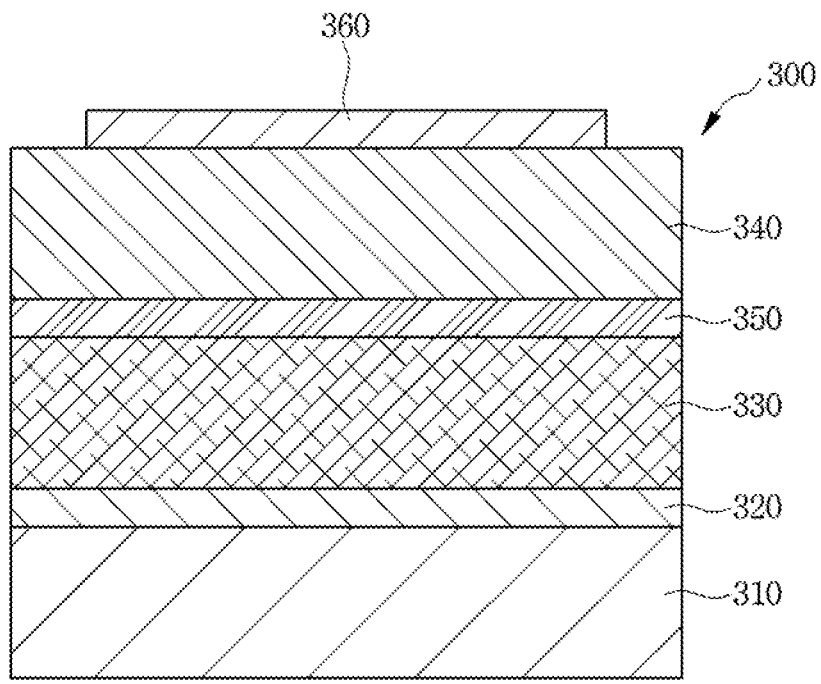
FIG. 3 is a cross-sectional view illustrating one surface of a light source according to an embodiment.
Figure 4:
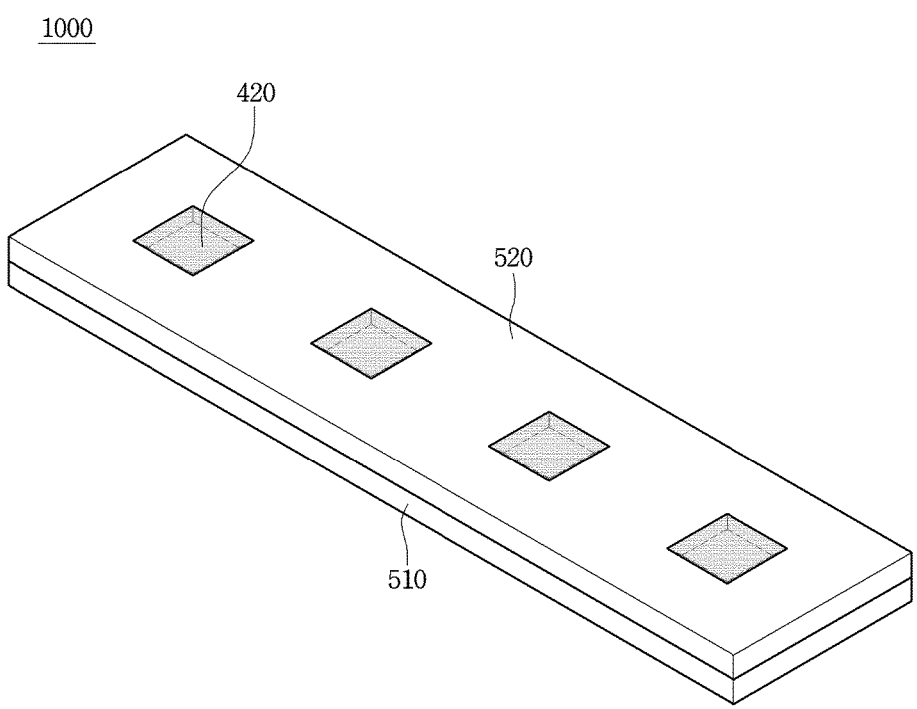
FIG. 4 is a perspective view of a light emitting device package assembly according to an embodiment.
Figure 5:
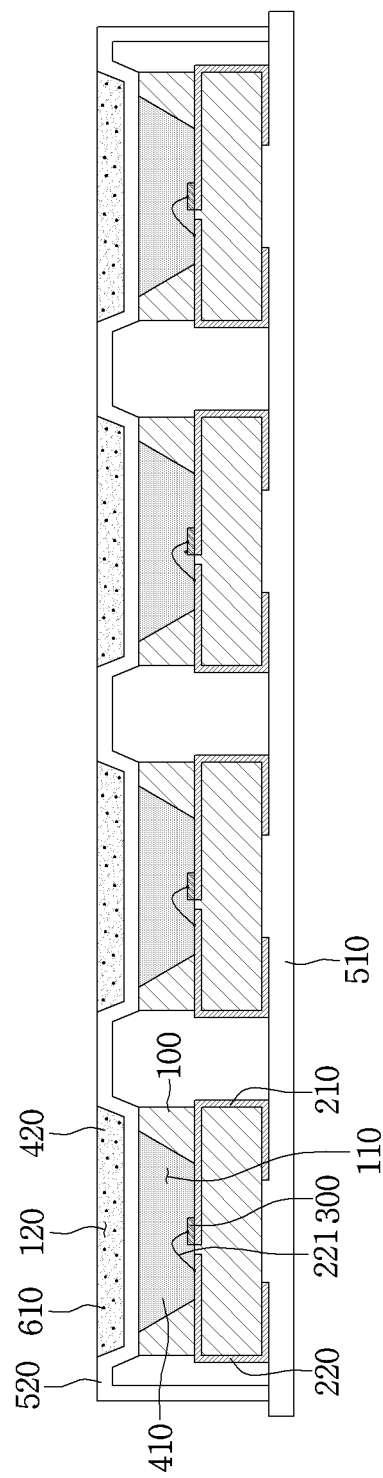
FIG. 5 is a cross-sectional view of the light emitting device package assembly according to an embodiment.

Further, the light source 300 may include at least one light emitting diode chip. For example, the light source 300 may include a colored light emitting diode chip or a UV light emitting diode chip. The light source 300 may also be a vertical light emitting diode chip. For example, as illustrated in FIG. 3, the light source 300 may include a conductive substrate 310, a reflective layer 320, a first conductive type semiconductor layer 330, a second conductive type semiconductor layer 340, an active layer 350, and a second electrode 360.

The conductive substrate 310 may include an electric conductor and support the reflective layer 320, the first conductive type semiconductor layer 330, the second conductive type semiconductor layer 340, the active layer 350, and the second electrode 360. Further, the conductive substrate 310 may be connected to the first conductive type semiconductor layer 330 through the reflective layer 320. That is, the conductive substrate 310 may be a first electrode for applying an electric signal to the first conductive type semiconductor layer 330.

In addition, the reflective layer 320 is disposed on the conductive substrate 310 and reflects light emitted from the active layer 350 upward. Also, the reflective layer 320 may be a conductive layer. Thus, the reflective layer 320 connects the conductive substrate 310 to the first conductive type semiconductor layer 330. Examples of materials used for the reflective layer 320 include a metal such as silver or aluminum.

In addition, the first conductive type semiconductor layer 330 is disposed on the reflective layer 320 and has a first conductive type. The first conductive type semiconductor layer 330 may be an n-type semiconductor layer. For example, the first conductive type semiconductor layer 330 may be an n-type GaN layer.

The second conductive type semiconductor layer 340 is disposed on the first conductive type semiconductor layer 330 and may be a p-type semiconductor layer facing the first conductive type semiconductor layer 330. For example, the second conductive type semiconductor layer 340 may be a p-type GaN layer.

In addition, the active layer 350 is disposed between the first conductive type semiconductor layer 330 and the second conductive type semiconductor layer 340. The active layer 350 may have a single quantum well structure, a multi quantum well (MQW) structure. Further, the active layer 350 may have a cycle of an InGaN well layer/AlGaN barrier layer or a cycle of an InGaN well layer/GaN barrier layer. A light emitting material of the active layer 350 can also vary according to a light emitting wavelength, for example, a blue wavelength, a red wavelength, and a green wavelength.

The second electrode 360 is disposed on the second conductive type semiconductor layer 340 and is connected to the second conductive type semiconductor layer 340. Further, the light source 300 may be a horizontal LED. Here, an additional wire is used for connecting the horizontal LED to the first lead electrode 210.

In addition, the light source 300 can be connected to the first lead electrode 210 through a bump and connected to the second lead electrode 220 through a wire 221. Particularly, the light source 300 can be directly disposed on the first lead electrode 210. However, the present disclosure is not limited to the above-described connection method. For example, the light source 300 may be connected to the lead electrodes 210 and 220 through a wire bonding, a die bonding, or a flip bonding process, but is not limited thereto.

In addition, the light emitting device 300 is disposed inside the first cavity of the main body and receives the electric signal through the first and second lead electrodes 210 and 220 to generate light. The first matrix 410 is also disposed inside the first cavity 110 of the main body and is disposed to surround the light emitting device 300 in the first cavity 110. The first matrix 410 may be filled into the cavity 110. Also, an external surface of the first matrix 410 exposed from the main body may be a light emission surface through which the light emitted from the light emitting device is emitted again. The light emission surface may also be flat or curved.

Further, the first matrix 410 can be formed of a polymer such as a silicon resin and be transparent. That is, the first matrix 410 may be formed of a transparent polymer. Also, the first matrix 410 may be formed of at least one of an organic material and an inorganic material.

In addition, the light emitting device package 1100 is disposed on a first substrate 510 including a printed circuit board such as a flexible printed circuit board (FPCB). The first and second lead electrodes 210 and 220 are also electrically connected to the first substrate 510. Also, the light emitting device 300 can be connected to the first substrate 510 through the first and second lead electrodes 210 and 220 to receive a driving signal from the first substrate 510.

In addition, the light conversion member 1200 includes a second substrate 520, a second matrix 420, and first light conversion particles 610. The second substrate 510 supports the second matrix 420 and the first light conversion particles 610. A second cavity 120 having an opened upper side is also defined in the second substrate 510.

Further, the second cavity 120 may be formed by performing a patterning, punching, cutting, or etching process on the second substrate 520. Also, the second cavity 120 may be formed by using a metal frame having the same shape as the second cavity 120 when the second substrate 520 is molded. The second cavity 120 may also have a cup shape or a concave container shape. Also, the first cavity 110 may have a surface shape such as a circular shape, a polygonal shape, or random shape, but is not limited thereto.

In addition, the second cavity 120 may have a side surface that is perpendicular to or inclined with respect to a bottom surface of the second cavity 120. For example, the second cavity 120 may have a width that gradually increases in a direction away from the light source 300. In the drawings, although the second cavity 120 has an angled surface, an embodiment is not limited thereto. For example, the second cavity 120 may have a curved surface. Since the second cavity 120 has the curved surface, the matrix can be more easily filled into the second cavity 120.

The second cavity 120 may also have a side surface that is coated with a high reflective material, for example, photo solder (PSR) resist ink, silver (Ag), or aluminum (Al) to improve light emitting efficiency of the light source 300. The first and second cavities 110 and 120 may also have sizes different from each other. In more detail, the second cavity 120 may have a size greater than that of the first cavity 110. For example, the second cavity 120 may have a width greater than that of the first cavity 110. Thus, a phenomenon in which light emitted from the light source 300 disposed in the first cavity 110 does not pass through the light conversion particles disposed in the second cavity 120, but leaks can be prevented to reduce light loss.

Also, when the light emitting device package 1100 and the light conversion member 1200 are combined with each other, light loss due to tolerance can be reduced. In more detail, the second cavity 120 has a width greater by about 1% to about 10% than that of the first cavity 110. When the second cavity 120 has a width greater by less than about 1% than that of the first cavity 110, the light loss due to the tolerance increases to deteriorate the efficiency. When the second cavity 120 has a width greater by more than about 10% than that of the first cavity 110, a distance between the first and second cavities 110 and 120 decreases to cause light interference, thereby deteriorating luminance.

The second substrate 520 may also include a light transmitting substrate and be transparent. For example, the second substrate 520 may include a polyethylene terephthalate (PET) substrate. However, the present disclosure is not limited thereto. For example, the second substrate may include various substrates having a light transmitting property.

The second substrate 520 is disposed to be spaced apart from the light source 300 disposed in the first cavity 110. For example, the second substrate 520 can be spaced a distance of about 0.5 mm to about 1.0 mm from the light source 300. When the spaced distance between the second substrate 520 and the light source 300 is less than about 0.5 mm, heat of the light source may be transferred to the light conversion particles disposed in the second cavity 120 of the second substrate 520 to deform the light conversion particles, thereby deteriorating reliability.

When the spaced distance between the second substrate 520 and the light source 300 is greater than about 1.0 mm, an amount of light transmitted to the light conversion particles disposed in the second cavity 120 is reduced to deteriorate overall luminance and light efficiency. Further, the second matrix 420 is disposed inside the second cavity 120 of the second substrate and may be filled into the second cavity 120. Also, an external surface of the second matrix 410 exposed from the second substrate 520 can be a light emission surface through which the light emitted from the light emitting device is emitted again. The light emission surface may be flat or curved.

In addition, the second matrix 420 may be formed of a polymer such as a silicon resin and be transparent. That is, the second matrix 420 may be formed of a transparent polymer. Also, the second matrix 420 may be formed of at least one of an organic material and an inorganic material. Further, the first matrix 410 may be formed of a material equal or similar to that of the second matrix 420.

In addition, the first light conversion particles 610 are disposed in the second matrix 420. For example, a plurality of first light conversion particles 610 may be dispersed within the second matrix 420. The second matrix 420 can also surround the first light conversion particles 610. That is, the second matrix 420 can uniformly disperse the first light conversion particles 610 therein.

Further, the light conversion particles 610 can convert a wavelength of light emitted from the light source 300. In particular, the first light conversion particles 610 receive light emitted from the light source 300 to convert a wavelength of the received light. For example, the first light conversion particles 610 can convert blue light emitted from the light source 300 into green or red light. That is, the first light conversion particles 610 can convert blue light into the green light having a wavelength band of about 520 nm to about 560 nm or red light having a wavelength band of about 630 nm to about 660 nm.

Further, the first light conversion particles 610 can convert ultraviolet rays emitted from the light source 300 into blue, green, or red light. That is, the first light conversion particles 610 can convert the ultraviolet rays into blue light having a wavelength band of about 430 nm to about 470 nm, green light having a wavelength band of about 520 nm to about 560 nm, or red light having a wavelength band of about 630 nm to about 660 nm.

That is, when the light source 300 is a blue light emitting diode generating blue light, the first light conversion particles 610 converting the blue light into the green or red light can be used. Further, when the light source 300 is a UV light emitting diode generating ultraviolet rays, the first light conversion particles 610 converting the ultraviolet rays into the green or red light can be used.

In addition, the first light conversion particles 610 may include at least one light conversion material of a phosphor and quantum dot. For example, the first light conversion particles 610 may include a phosphor converting blue light into green or red light or a phosphor converting ultraviolet rays into blue, green, or red light. Alternatively, the first light conversion particles 610 may include a quantum dot QD. For example, the first light conversion particles 610 may include a quantum dot converting blue light into green or red light or a quantum dot converting ultraviolet rays into blue, green, or red light.

In addition, the quantum dot QD corresponds to a core nano crystal and a shell nano crystal surrounding the core nano crystal. Also, the quantum dot QD may include an organic ligand coupled to the shell nano crystal. Further, the quantum dot QD may include an organic coating layer surrounding the shell nano crystal.

The shell nano crystal may have a structure constituted by at least two layers and be disposed on a surface of the core nano crystal. The quantum dot QD can also convert a wavelength of light incident into the core nano crystal into light having a long wavelength through the shell nano crystal forming a shell layer to improve light efficiency.

The quantum dot may be, for example, a particle having a single layer or multi-layered structure including at least one kind of semiconductor crystal selected from the group consisting of CdS, CdO, CdSe, CdTe, Cd3P2, Cd3As2, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, H12, AgI, AgBr, Al2O3, Al2S3, Al2Se3, Al2Te3, Ga2O3, Ga2S3, Ga2Se3, Ga2Te3, In2O3, In2S3, In2Se3, In2Te3, SiO2, GeO2, SnO2, SnS, SnSe, SnTe, PbO, PbO2, PbS, PbSe, PbTe, AlN, AlP, AlAs, AlSb, GaN, GaP, GaAs, GaSb, GaInP2, InN, InP, InAs, InSb, In2S3, In2Se3, TiO2, BP, Si, Ge, and a combination thereof. The quantum dot may also have a diameter of about 1 nm to about 10 nm.

Further, the wavelength of the light emitted from the quantum dot QD can be adjusted according to a size of the quantum dot QD or a molar ratio of a molecular cluster compound and a nano particle precursor in a synthesis process. The organic ligand may be formed of at least one of pyridine, mercapto alcohol, thiol, phosphine, and phosphine oxide. The organic ligand may stabilize the unstable quantum dot QD after the synthesis process is performed.

After the synthesis process is performed, a dangling bond is formed outside the quantum dot QD. Here, the quantum dot QD may be unstable due to the dangling bond. However, one end of the organic ligand can be in a non-bonded state, and the non-bonded one end of the organic ligand can be bonded to the dangling bond to stabilize the quantum dot QD.

Particularly, when the quantum dot QD has a radius less than a Bohr radius of an exciton constituted by an electron and hole, which are excited by light and electricity, a quantum confinement effect occurs. Thus, the quantum dot QD has a discrete energy level to change an intensity of an energy gap. In addition, a charge can be limited within the quantum dot QD to provide high light emitting efficiency. In addition, a charge can be limited within the quantum dot QD to provide high light emitting efficiency.

The quantum dot QD can also be changed in emission wavelength according to a particle size thereof, unlike a general fluorescent dye. That is, when the particle size is gradually decreased, the quantum dot QD emits light having a short wavelength. Thus, the particle size can be adjusted to emit visible light having a desired wavelength. Also, since the quantum dot QD has an extinction coefficient greater by about 100 times to about 1,000 times than that of the general fluorescent dye and quantum yield greater than that of the general fluorescent dye, the quantum dot QD emits very intense light.

In addition, the quantum dot QD can be synthesized by a chemical wet etching process. Here, the chemical wet etching process corresponds to a precursor material being immersed into an organic solvent to grow particles. Thus, the quantum dot QD can be synthesized through the chemical wet etching process.

Particles for improving the dispersibility can be further disposed in the first matrix 410. The particles for improving the dispersibility may be transparent and may include an inorganic material. In more detail, examples of the material used as the particles for improving the dispersibility include oxide such as silicon oxide. For example, silica particles may be used as the particles for improving the dispersibility.

Each of the particles for improving the dispersibility can have a diameter of about 10 nm to about 10 μm. The particles for improving the dispersibility also perform a function for improving dispersibility of the first light conversion particles 610 within the first matrix 410. Also, the particles for improving the dispersibility perform a dispersion particles function for changing a path of incident light.

Figure 6:
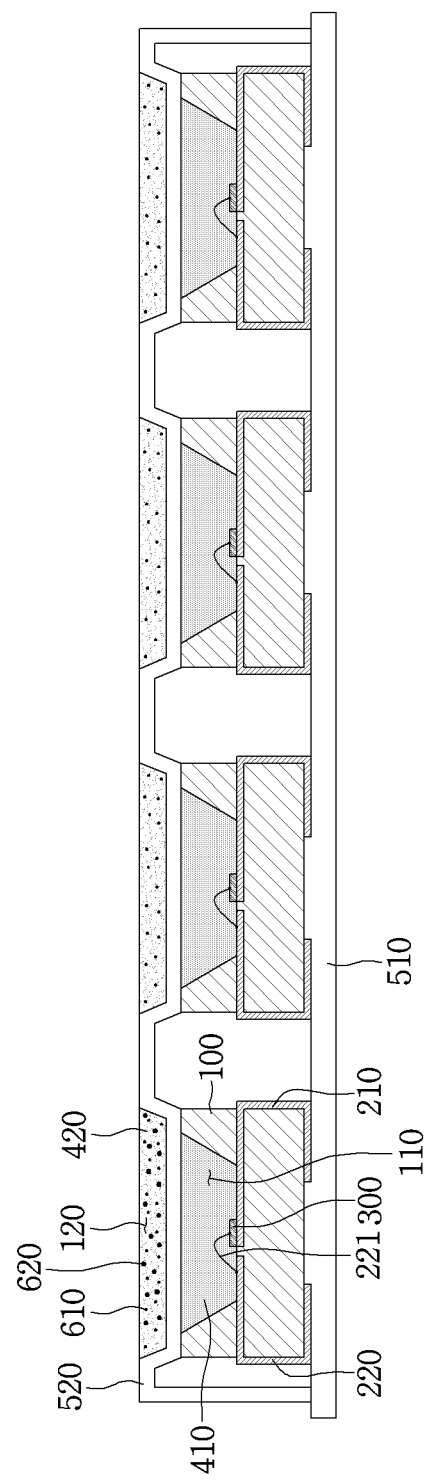
FIGS. 6 and 7 are various cross-sectional views of the light emitting device package assembly according to an embodiment.
Figure 7:
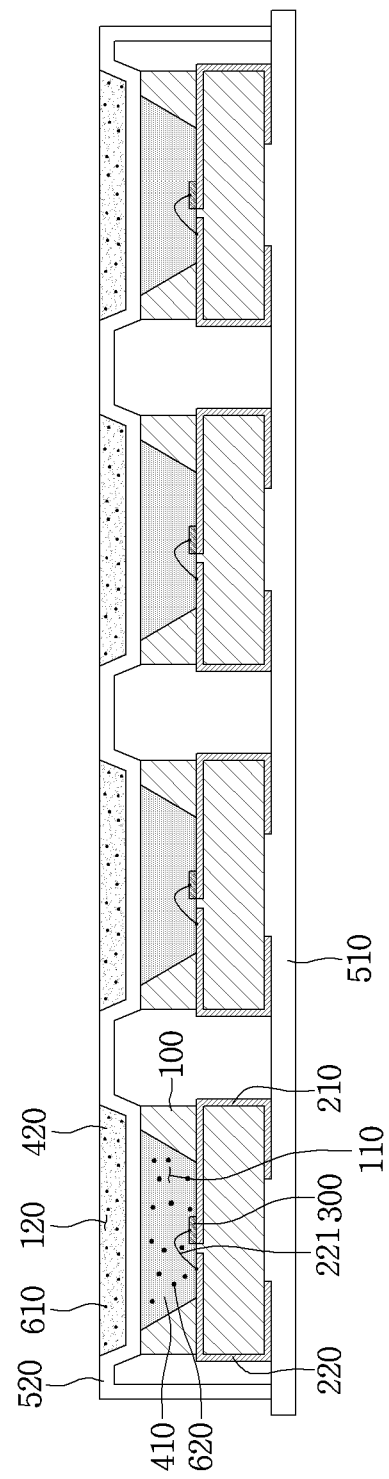

Referring to FIGS. 6, and 7, second light conversion particles 620 may be further provided. In more detail, the second light conversion particles 620 are disposed in at least one matrix of the first and second matrixes 410 and 420. The second light conversion particles 620 may include at least one light conversion material of a phosphor and quantum dot.

Referring to FIG. 6, the second light conversion particles 620 are disposed in the second matrix 420. That is, the first light conversion particles 610 and the second light conversion particles 620 are disposed in the second matrix 420. For example, blue light can be emitted from the light source 300, and the first light conversion particles 610 can include a phosphor converting the blue light into green light. Also, the second light conversion particles 620 may include a quantum dot converting the blue light into red light.

Alternatively, blue light can be emitted from the light source 300, and the first light conversion particles 610 can include a quantum dot converting the blue light into green light. Also, the second light conversion particles 620 may include a phosphor converting the blue light into red light. Alternatively, blue light can be emitted from the light source 300, and the first light conversion particles 610 can include a quantum dot converting the blue light into green light. Also, the second light conversion particles 620 may include a quantum dot converting the blue light into red light.

Alternatively, blue light can be emitted from the light source 300, and the first light conversion particles 610 can include a phosphor converting the blue light into green light. Also, the second light conversion particles 620 may include a phosphor converting the blue light into red light.

Further, the first and second light conversion particles 610 and 620 are disposed in the second matrix 420 to uniformly maintain a distance between the first and second light conversion particles 610 and 620 and the light source 300, thereby preventing the first and second light conversion particles 610 and 620 from being deformed and thus improving reliability.

Referring to FIG. 7, the second light conversion particles 620 are disposed in the first matrix 410. That is, the first light conversion particles 610 are disposed in the second matrix 420, and the second light conversion particles 620 are disposed in the second matrix 420.

For example, blue light can be emitted from the light source 300, and the first light conversion particles 610 can include a phosphor converting the blue light into green light. Also, the second light conversion particles 620 can include a quantum dot converting the blue light into red light. Alternatively, blue light can be emitted from the light source 300, and the first light conversion particles 610 can include a quantum dot converting the blue light into green light. Also, the second light conversion particles 620 can include a phosphor converting the blue light into red light.

Alternatively, blue light can be emitted from the light source 300, and the first light conversion particles 610 can include a quantum dot converting the blue light into green light. Also, the second light conversion particles 620 can include a quantum dot converting the blue light into red light. Alternatively, blue light can be emitted from the light source 300, and the first light conversion particles 610 can include a phosphor converting the blue light into green light. Also, the second light conversion particles 620 can include a phosphor converting the blue light into red light.

Hereinafter, a light emitting device package assembly according to another embodiment will be described with reference to FIGS. 8 and 9. The same or similar descriptions between the light emitting device package assembly according to another embodiment and the light emitting device package assembly according to the foregoing embodiment will be omitted, and also, the same reference numbers are given to the same constituents.

Figure 8:
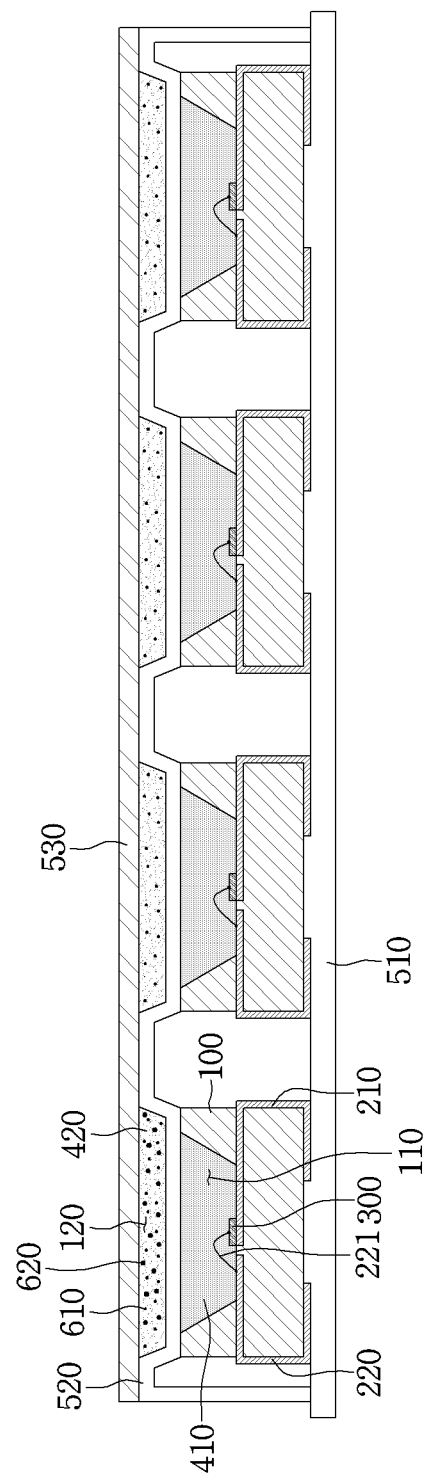
FIGS. 8 and 9 are various cross-sectional views of a light emitting device package assembly according to another embodiment.
Figure 9:
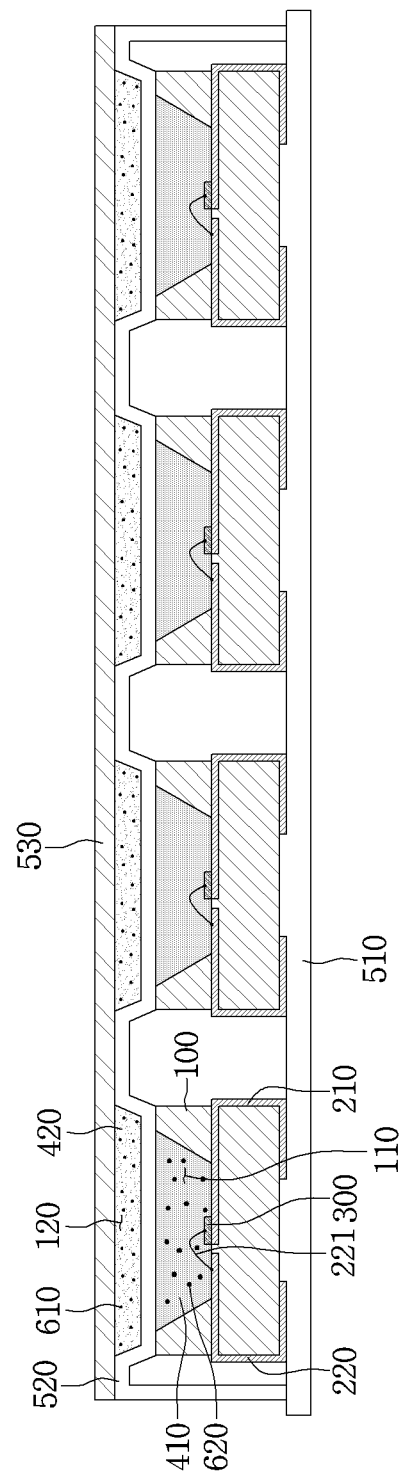

Referring to FIGS. 8 and 9, the light emitting device package assembly according to another embodiment includes a light emitting device package 1100 and a light conversion member 1200. The light conversion member 1200 is disposed on the light emitting device package 1100. In more detail, the light conversion member 1200 is disposed to be spaced apart from the light emitting device package 1100 on the light emitting device package 1100.

Since the light emitting device package 1100 is the same as or similar to the light emitting device package according to the foregoing embodiment, the detailed descriptions are omitted. Further, the light conversion member 1200 includes a second substrate 520, a second matrix 420, first light conversion particles 610, and a third substrate 530.

That is, the light conversion member 1200 according to this embodiment includes the third substrate 530, unlike the light conversion member according to the foregoing embodiment. The third substrate 530 is disposed on the second substrate 520. In more detail, the third substrate 530 is disposed on the second matrix 420. The second substrate 520 may also be combined with the third substrate 530.

Further, the second matrix 420 is surrounded by the second and third substrates 520 and 530. Thus, the second matrix 420 can be sealed by the second and third substrates 520 and 530. That is, the second matrix 420 is disposed in a second cavity 120 defined in the second substrate 520 and is sealed from the outside by the second and third substrates 520 and 530.

In addition, the second and third substrates 520 and 530 may be formed of the same material or materials similar to each other. At least one substrate of the second and third substrates 520 and 530 may be formed of an inorganic material. For example, at least one substrate of the second and third substrates 520 and 530 may be formed of an inorganic material such as silicon oxide or silicon nitride. Thus, the second and third substrates 520 and 530 may accommodate the second matrix 420, and also prevent external physical impacts or external oxygen and/or moisture from be applied or immersed into the second matrix 420.

Referring to FIGS. 8 and 9, the second light conversion particles 620 are disposed in at least one matrix of the first and second matrixes 410 and 420. The second light conversion particles 620 can include at least one light conversion material of a phosphor and quantum dot.

Referring to FIG. 8, the second light conversion particles 620 are disposed in the second matrix 420. That is, the first light conversion particles 610 and the second light conversion particles 620 are disposed in the second matrix 420. For example, blue light can be emitted from the light source 300, and the first light conversion particles 610 can include a phosphor converting the blue light into green light. Also, the second light conversion particles 620 can include a quantum dot converting the blue light into red light.

Alternatively, blue light can be emitted from the light source 300, and the first light conversion particles 610 can include a quantum dot converting the blue light into green light. Also, the second light conversion particles 620 can include a phosphor converting the blue light into red light.

Alternatively, blue light can be emitted from the light source 300, and the first light conversion particles 610 can include a quantum dot converting the blue light into green light. Also, the second light conversion particles 620 can include a quantum dot converting the blue light into red light. Alternatively, blue light can be emitted from the light source 300, and the first light conversion particles 610 can include a phosphor converting the blue light into green light. Also, the second light conversion particles 620 can include a phosphor converting the blue light into red light.

The first and second light conversion particles 610 and 620 are disposed in the second matrix 420 to uniformly maintain a distance between the first and second light conversion particles 610 and 620 and the light source 300, thereby preventing the first and second light conversion particles 610 and 620 from being deformed and thus improving reliability.

Referring to FIG. 9, the second light conversion particles 620 are disposed in the first matrix 410. That is, the first light conversion particles 610 are disposed in the second matrix 420, and the second light conversion particles 620 are disposed in the second matrix 420. For example, blue light can be emitted from the light source 300, and the first light conversion particles 610 can include a phosphor converting the blue light into green light. Also, the second light conversion particles 620 can include a quantum dot converting the blue light into red light.

Alternatively, blue light can be emitted from the light source 300, and the first light conversion particles 610 can include a quantum dot converting the blue light into green light. Also, the second light conversion particles 620 can include a phosphor converting the blue light into red light.

Alternatively, blue light can be emitted from the light source 300, and the first light conversion particles 610 can include a quantum dot converting the blue light into green light. Also, the second light conversion particles 620 can include a quantum dot converting the blue light into red light. Alternatively, blue light can be emitted from the light source 300, and the first light conversion particles 610 can include a phosphor converting the blue light into green light. Also, the second light conversion particles 620 can include a phosphor converting the blue light into red light.

Hereinafter, a light emitting device package assembly according to still another embodiment will be described with reference to FIGS. 10 and 11. The same or similar descriptions between the light emitting device package assembly according to this embodiment and the light emitting device package assemblies according to the foregoing embodiments will be omitted, and also, the same reference numbers are given to the same constituents.

Figure 10:
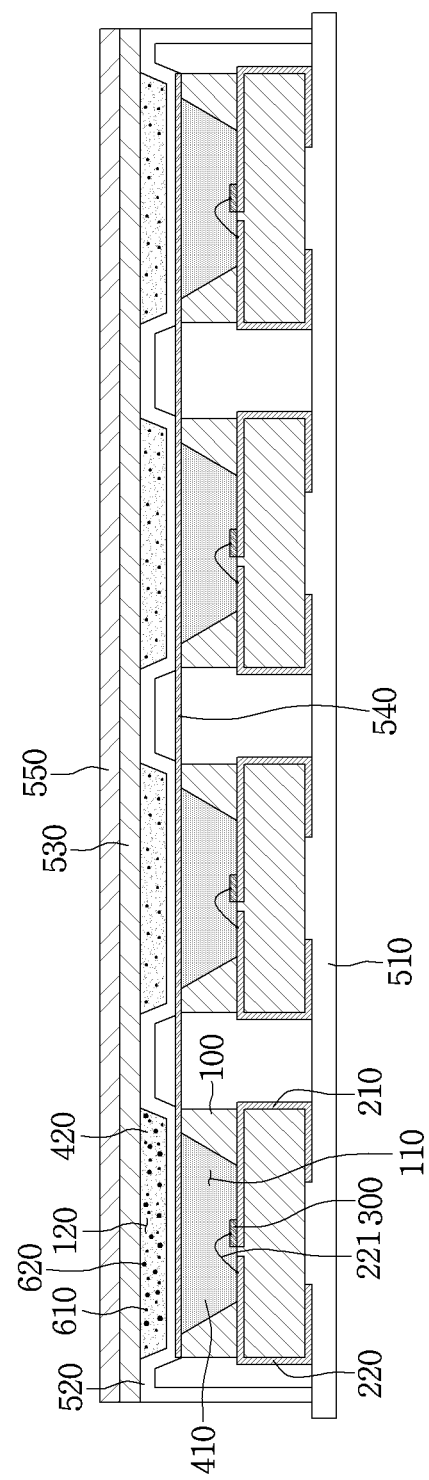
FIGS. 10 and 11 are various cross-sectional views of a light emitting device package according to further another embodiment.
Figure 11:
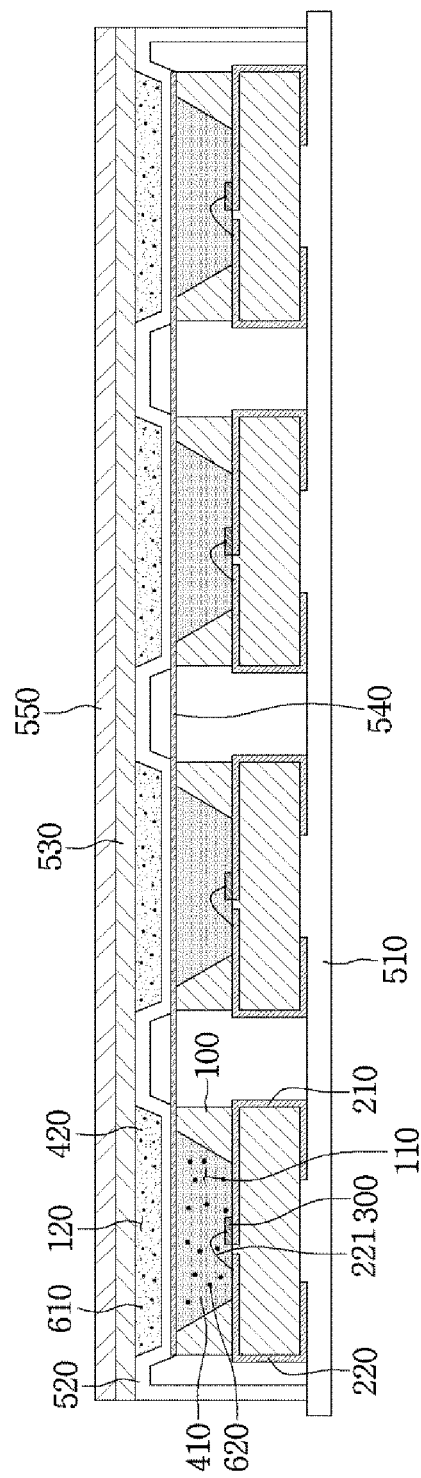

Referring to FIGS. 10 and 11, the light emitting device package assembly according to another embodiment includes a light emitting device package 1100 and a light conversion member 1200. The light conversion member 1200 is disposed on the light emitting device package 1100. In more detail, the light conversion member 1200 is disposed to be spaced apart from the light emitting device package 1100 on the light emitting device package 1100. Since the light emitting device package 1100 is the same as or similar to the light emitting device packages according to the foregoing embodiments, the detailed descriptions are omitted.

The light conversion member 1200 includes a second substrate 520, a third substrate 530, a fourth substrate 540, a fifth substrate 550, a second matrix 420, and first light conversion particles 610. That is, the light conversion member 1200 according to this embodiment further includes the fourth substrate 540 and the fifth substrate 550, and the light conversion members according to the foregoing embodiments.

As shown, the fourth substrate 540 is disposed on the second substrate 520. In more detail, the third substrate 530 is disposed on the second matrix 420. The second substrate 520 may also be combined with the third substrate 530. The second matrix 420 is surrounded by the second and third substrates 520 and 530 and thus is sealed by the second and third substrates 520 and 530.

That is, the second matrix 420 is disposed in a second cavity 120 defined in the second substrate 520 and is sealed from the outside by the second and third substrates 520 and 530. The second and third substrates 520 and 530 may be formed of the same material or materials similar to each other. For example, at least one substrate of the second and third substrates 520 and 530 can include a light transmitting or transparent substrate formed of polyethylene terephthalate (PET).

The fourth electrode 540 is disposed under the second substrate 520. That is, the fourth substrate 520 is disposed between the second matrix 420 and the second substrate 520. Also, the fifth substrate 550 is disposed on the third substrate 530. Thus, the third substrate 530 is disposed between the second matrix 420 and the fifth substrate 550.

The fourth and fifth substrates 540 and 550 may be formed of the same material or materials similar to each other. At least one substrate of the fourth and fifth substrates 540 and 550 may be formed of an inorganic material. For example, at least one substrate of the fourth and fifth substrates 540 and 550 may be formed of an inorganic material such as silicon oxide or silicon nitride. Thus, the fourth and fifth substrates 540 and 550 can prevent external physical impacts or external oxygen and/or moisture from being applied or immersed into the second matrix 420.

Referring to FIGS. 10 and 11, the second light conversion particles 620 are disposed in at least one matrix of the first and second matrixes 410 and 420. The second light conversion particles 620 can include at least one light conversion material of a phosphor and quantum dot. Referring to FIG. 10, the second light conversion particles 620 are disposed in the second matrix 420. That is, the first light conversion particles 610 and the second light conversion particles 620 are disposed in the second matrix 420.

For example, blue light can be emitted from the light source 300, and the first light conversion particles 610 can include a phosphor converting the blue light into green light. Also, the second light conversion particles 620 can include a quantum dot converting the blue light into red light. Alternatively, blue light can be emitted from the light source 300, and the first light conversion particles 610 can include a quantum dot converting the blue light into green light. Also, the second light conversion particles 620 can include a phosphor converting the blue light into red light.

Alternatively, blue light can be emitted from the light source 300, and the first light conversion particles 610 can include a quantum dot converting the blue light into green light. Also, the second light conversion particles 620 can include a quantum dot converting the blue light into red light. Alternatively, blue light can be emitted from the light source 300, and the first light conversion particles 610 can include a phosphor converting the blue light into green light. Also, the second light conversion particles 620 can include a phosphor converting the blue light into red light.

The first and second light conversion particles 610 and 620 are disposed in the second matrix 420 to uniformly maintain a distance between the first and second light conversion particles 610 and 620 and the light source 300, thereby preventing the first and second light conversion particles 610 and 620 from being deformed and thus improving reliability.

Referring to FIG. 11, the second light conversion particles 620 are disposed in the first matrix 410. That is, the first light conversion particles 610 are disposed in the second matrix 420, and the second light conversion particles 620 are disposed in the second matrix 420. For example, blue light can be emitted from the light source 300, and the first light conversion particles 610 can include a phosphor converting the blue light into green light. Also, the second light conversion particles 620 can include a quantum dot converting the blue light into red light.

Alternatively, blue light can be emitted from the light source 300, and the first light conversion particles 610 can include a quantum dot converting the blue light into green light. Also, the second light conversion particles 620 can include a phosphor converting the blue light into red light. Alternatively, blue light can be emitted from the light source 300, and the first light conversion particles 610 can include a quantum dot converting the blue light into green light. Also, the second light conversion particles 620 can include a quantum dot converting the blue light into red light.

Alternatively, blue light can be emitted from the light source 300, and the first light conversion particles 610 can include a phosphor converting the blue light into green light. Also, the second light conversion particles 620 can include a phosphor converting the blue light into red light.

The light emitting device package assembly according to the embodiments can be easily fabricated by the light conversion member including the substrate having the cavity. In more detail, the substrate having the cavity formed in the position corresponding to the light source is disposed on the light emitting device package, and the light conversion material is disposed within the cavity to provide the light conversion member on the plurality of light emitting device packages at the same time through only one process.

That is, the light conversion member is disposed on each of the plurality of light emitting device packages on the printed circuit board through only one process. Therefore, the process of fabricating the light emitting device package assembly is improved to improve the process efficiency.

Figure 12:
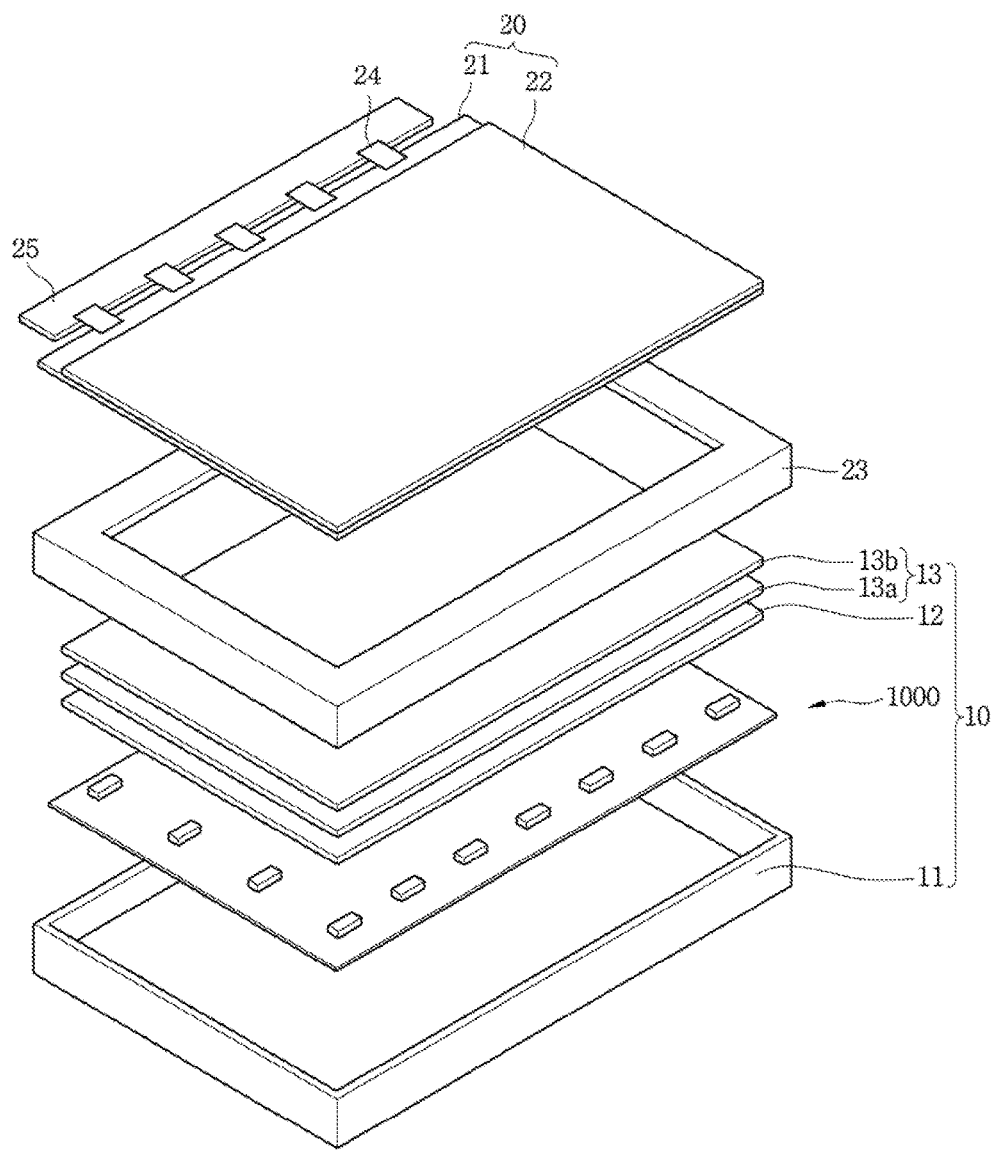
FIGS. 12 and 13 are views of a display apparatus to which the light emitting device package assembly is applied according to the embodiments.

Hereinafter, a display apparatus to which the light emitting device package assemblies according to the embodiments are applied will be described with reference to FIGS. 12 and 13. Referring to FIG. 12, a display apparatus according to an embodiment includes a backlight unit 10 and a liquid crystal panel 20.

The backlight unit 10 emits light onto the liquid crystal panel 20 and may be a surface light source and uniformly radiate light onto a bottom surface of the liquid crystal panel 20. Further, the backlight unit 10 is disposed under the liquid crystal panel 20 and includes a bottom cover 11, a light emitting device package assembly 1000, a reflective sheet 12, and an optical sheet 13.

The bottom cover 11 has a shape with an upper portion opened. In more detail, the bottom cover 11 has a shape of which a lower portion is closed, and an upper portion is opened. The bottom cover 11 can thus accommodate the light emitting device package assembly 1000, the reflective sheet 12, and the optical sheet 13. The light emitting device package assembly 1000 can include the light emitting device package assemblies according to the foregoing embodiments and emit light onto the liquid crystal panel 20.

Further, the reflective sheet 12 is disposed on the light emitting device package assembly 1000 and re-reflects the light upward when the light emitted from the light emitting device package assembly 1000 is incident downward. In addition, the optical sheet 13 is disposed on the reflective sheet 12 and can include optical sheets such as a diffusion film 13a or a light collection film 13b. Here, the diffusion film 13a and the light collection film 13b diffuse and collect light to improve luminance distribution of the display panel and improve luminance.

In addition, the liquid crystal panel 20 is disposed on the optical sheets. Also, the liquid crystal panel 20 is disposed on a panel guide 23 and guided by the panel guide 23. Further, the liquid crystal panel 20 can adjust the intensity of the transmitting light to display an image. That is, the liquid crystal panel 20 can display an image by using light emitted from the backlight unit 10.

Further, the liquid crystal panel 20 includes a TFT substrate 21, a color filter substrate 22, and a liquid crystal layer between the TFT substrate 21 and the color filter substrate 22. Also, the liquid crystal panel 20 can include polarizer filters. In addition, in the TFT substrate 21, a plurality of gate lines and data lines cross each other to define pixels, and a thin film transistor TFT is provided on each of the crossing area and then connected to one-to-one correspond to pixel electrodes mounted on the pixels.

In addition, the color filter substrate 22 can include R, G, and B color filters corresponding to the pixels, a black matrix disposed on edges of the R, G, and B color filters to cover the gate lines, the data lines, and the thin film transistor TFT, and a common electrode covering the R, G, and B color filters and the black matrix. A driving PCB 25 for supplying a driving signal to the gate lines and the data lines is disposed on an edge of the liquid crystal panel 20. The driving PCB 25 can be electrically connected to the liquid crystal panel 20 by a chip on film (COF) 24. Here, the COF 24 may be changed into a tape carrier package (TCP).

Figure 13:
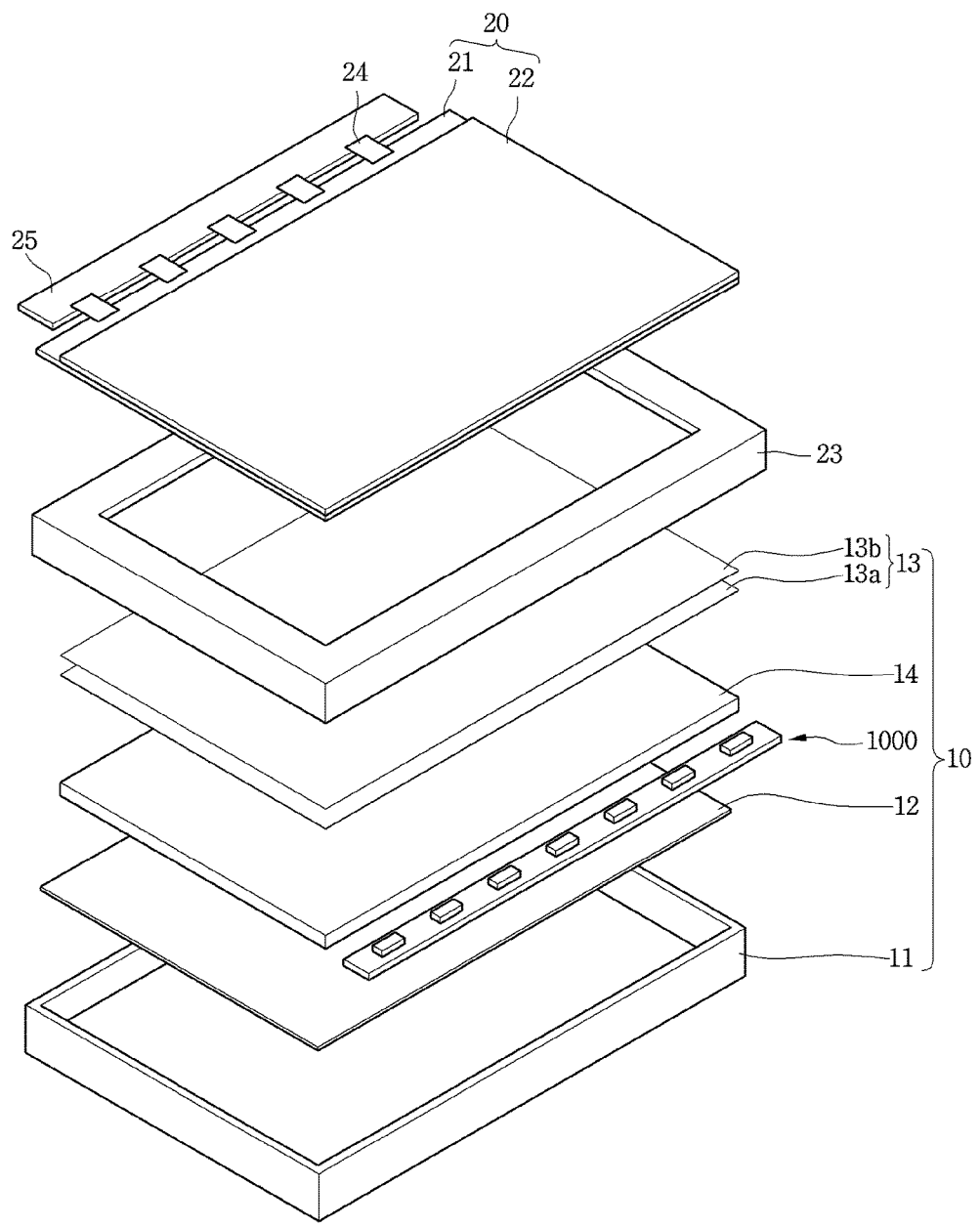

Referring to FIG. 13, a display apparatus according to another embodiment includes a backlight unit 10 and a liquid crystal panel 20. The backlight unit 10 emits light onto the liquid crystal panel 20 and may be a surface light source and uniformly radiate light onto a bottom surface of the liquid crystal panel.

Further, the backlight unit 10 is disposed under the liquid crystal panel 20 and includes a bottom cover 11, a light emitting device package assembly 1000, a reflective sheet 12, an optical sheet 13, and a light guide plate 14. The bottom cover 11 has a shape with an upper side opened. In more detail, the bottom cover 11 has a shape of which a lower portion is closed, and an upper portion is opened and thus can accommodate the light emitting device package assembly 1000, the reflective sheet 12, the optical sheet 13, and the light guide plate 14.

In addition, the light guide plate 14 is disposed in the bottom cover 11. The light guide plate 14 is also disposed on the reflective sheet 12. Further, the light guide plate 200 emits light incident from the light emitting device package assembly 1000 upward through totally reflection, refraction, and scattering. The reflective sheet 12 is disposed under the light guide plate 14. In more detail, the reflective sheet 12 is disposed between the light guide plate 14 and a bottom surface of the bottom cover 11. The reflective sheet 12 reflects light emitted from a bottom surface of the light guide plate 14 upward.

The light emitting device package assembly 1000 can include the light emitting device package assemblies according to the foregoing embodiments and emit light onto the liquid crystal panel 20. Further, the light emitting device package assembly 1000 is disposed on one side surface of the light guide plate 14. The light emitting device package assembly 1000 generates light to allow the light to be incident into the light guide plate 14 through a side surface of the light guide plate 14.

Further, the optical sheet 13 is disposed on the light guide plate 14 and may include optical sheets such as a diffusion film 13*a* or a light collection film 13*b*. Here, the diffusion film 13*a* and the light collection film 13*b* diffuse and collect light to improve luminance distribution of the display panel and improve luminance. Since the liquid crystal panel 20 is the same as or similar to the display panel of FIG. 11, its detailed description are omitted.

Hereinafter, a process of fabricating the light emitting device package assembly according to an embodiment will be described. In the description with respect to the process of fabricating the light emitting device package assembly according to an embodiment, descriptions with respect to the same constituents as those of the light emitting device package according to the foregoing embodiment will be omitted.

The process of fabricating the light emitting device package according to an embodiment includes preparing the light emitting device package 1100 of FIG. 1 and the light conversion member 1200 of FIG. 2. The light emitting device package 1100 is disposed on a first substrate 510. In more detail, a plurality of light emitting device packages is disposed on the first substrate 510.

Further, a plurality of cavities are formed in the light conversion member 1200, and a matrix and light conversion particles dispersed in the matrix are disposed in each of the cavities. Then, the light emitting device package 1100 and the light conversion member 1200 are combined with each other. In more detail, because the light conversion member 1200 is disposed on the light emitting device package 1100, the light emitting device package 1100 and the light conversion member 1200 can be combined with each other. That is, the first substrate 510 and the second substrate 520 are combined with each other, and then the light conversion member 1200 is disposed on the light emitting device package 1100.

Further, the light emitting device package 1100 and the light conversion member 1200 directly contact each other and then are combined with each other. Alternatively, to enhance adhesion force between the light emitting device package 1100 and the light conversion member 1200, an adhesion material can be applied between the light emitting device package 1100 and the light conversion member 1200 to form an adhesion layer. Then, the light emitting device package 1100 and the light conversion member 1200 can be combined with each other.

Here, the light emitting device package 1100 and the light conversion member 1200 may be combined with each other so that the first and second cavities 110 and 120 correspond to each other, i.e., are disposed at position at which the first and second cavities 110 and 120 overlap each other. As described above, the second cavity can have a size greater than that of the first cavity according to a tolerance during the combination process to reduce light loss due to the tolerance.

Therefore, the light emitting device package assembly can be fabricated by the process of fabricating the light emitting device package assembly according to the embodiment to simply the fabrication process. That is, the light conversion member is disposed on each of the plurality of light emitting device packages through one adhesion process to improve the process efficiency.

Also, since a distance between the light conversion member and the light emitting device package is controllable, the deformation of the light conversion member, i.e., the light conversion particles due to heat of the light source are prevented to improve the reliability.

The light emitting device package assembly according to the embodiments can be easily fabricated by the light conversion member including the substrate having the cavity. In more detail, the substrate having the cavity formed in the position corresponding to the light source is disposed on the light emitting device package, and the light conversion material is disposed within the cavity to provide the light conversion member on the plurality of light emitting device packages at the same time through only one process. Therefore, the process of fabricating the light emitting device package assembly is improved to improve the process efficiency.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A light emitting device package assembly comprising:
   a first substrate;
   a plurality of light emitting device packages disposed on the first substrate;
   a light conversion member on the light emitting device packages; and
   a third substrate disposed on the light conversion member and spaced from the first substrate, the third substrate comprising an inorganic material including silicon oxide or silicon nitride,
   wherein each of the light emitting device packages comprises:
   a main body disposed on the first substrate and including a first cavity;
   a light source disposed in the first cavity and spaced apart from the first substrate; and
   a first matrix disposed in the first cavity and spaced apart from the first substrate,
   wherein the light conversion member comprises:
   a second substrate disposed on a top surface of the first matrix and spaced apart from the main body, the second substrate comprising a plurality of second cavities;
   a plurality of second matrices disposed in the plurality of second cavities, respectively, and spaced apart from the first matrix of the main body; and
   first light conversion particles disposed in the second matrices, respectively, wherein the plurality of light emitting device packages are spaced apart from each other, wherein the second substrate surrounds outermost light emitting device packages among the plurality of light emitting device packages and contacts the first substrate, wherein the third substrate contacts portions of a top surface of the second matrices and the second substrate, wherein the plurality of second matrices are spaced apart from each other, and the second matrices and the second substrate have top surfaces in the same plane, and wherein the third substrate has a first surface and a second surface opposite to the first surface, the first surface and the second surface are flat and are parallel to each other.

2. The light emitting device package assembly according to claim 1, wherein the light conversion member further comprises second light conversion particles disposed in the second matrices.

3. The light emitting device package assembly according to claim 2, wherein each of the first and second light conversion particles comprises at least one of a quantum dot and phosphor.

4. The light emitting device package assembly according to claim 1, further comprising second light conversion particles disposed in at least one of the first matrix and second matrices.

5. The light emitting device package assembly according to claim 4, wherein each of the first and second light conversion particles comprises at least one of a quantum dot and phosphor.

6. The light emitting device package assembly according to claim 1, wherein the second cavity overlaps the first cavity.

7. The light emitting device package assembly according to claim 1, wherein the first matrix comprises an organic material.

8. The light emitting device package assembly according to claim 1, wherein the first matrix comprises an inorganic material.

9. The light emitting device package assembly according to claim 1, wherein the third substrate is disposed to cover the second cavities.

10. The light emitting device package assembly according to claim 9, wherein the second substrate and the third substrate are combined with each other.

11. The light emitting device package assembly according to claim 9, wherein the second matrices are surrounded by the second and third substrates and are disposed between the second substrate and the third substrate.

12. The light emitting device package assembly according to claim 9, further comprising:

a fourth substrate disposed between the first matrix and the second substrate; and a fifth substrate disposed on the third substrate.

13. The light emitting device package assembly according to claim 12, wherein the second substrate comprises polyethylene terephthalate (PET).

14. The light emitting device package assembly according to claim 13, wherein each of the fourth and fifth substrates comprises an inorganic material.

15. The light emitting device package assembly according to claim 1, wherein a lower portion of the second cavity has a width greater than a width of an upper portion of the first cavity.

16. The light emitting device package assembly according to claim 15, wherein the second cavity has a width that is greater by about 1% to about 10% than that of the first cavity.

17. The light emitting device package assembly according to claim 1, wherein at least one of the first and second cavities has a curved surface.

18. The light emitting device package assembly according to claim 1, wherein the second substrate and a corresponding light source are spaced a distance of about 0.5 mm to about 1.0 mm from each other.

* * * * *